(12) United States Patent
Sabbag

(10) Patent No.: US 9,892,033 B1
(45) Date of Patent: Feb. 13, 2018

(54) MANAGEMENT OF MEMORY UNITS

(71) Applicant: AVAGO TECHNOLOGIES GENERAL IP (SINGAPORE) PTE. LTD., Yishun (SG)

(72) Inventor: Erez Sabbag, Kiryat Tivon (IL)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 52 days.

(21) Appl. No.: 14/313,821

(22) Filed: Jun. 24, 2014

(51) Int. Cl.
*G06F 12/00* (2006.01)
*G06F 12/02* (2006.01)

(52) U.S. Cl.
CPC .. *G06F 12/0246* (2013.01); *G06F 2212/7205* (2013.01); *G06F 2212/7208* (2013.01)

(58) Field of Classification Search
CPC ......... G06F 12/0246; G06F 2212/7205; G06F 2212/7208; G11C 16/26; G11C 16/10
See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,559,956 A * | 9/1996 | Sukegawa ........... G06F 12/0246 711/E12.014 |
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris |
| 5,729,490 A | 3/1998 | Calligaro et al. |
| 5,740,395 A | 4/1998 | Wells |
| 5,745,418 A | 4/1998 | Ting-Chung Hu et al. |
| 5,778,430 A | 7/1998 | Ish |
| 5,793,774 A | 8/1998 | Usui et al. |
| 5,920,578 A | 7/1999 | Zook et al. |
| 5,926,409 A | 7/1999 | Engh et al. |

(Continued)

FOREIGN PATENT DOCUMENTS

WO  WO2009053963 A2  4/2009

OTHER PUBLICATIONS

Search Report of PCT Patent Application WO 2009/118720 A3, dated Mar. 4, 2010.

(Continued)

*Primary Examiner* — Charles Rones
*Assistant Examiner* — Nanci Wong
(74) *Attorney, Agent, or Firm* — Sheridan Ross P.C.

(57) ABSTRACT

A method for memory management, the method may include calculating, by a memory controller, an estimate of an effect of read operations on a first flash memory entity; and performing, by the memory controller, at least one memory management operation in response to the estimate of the effect of read operations on the first flash memory entity.

21 Claims, 5 Drawing Sheets

(56) References Cited

U.S. PATENT DOCUMENTS

| | | | |
|---|---|---|---|
| 5,933,368 A | 8/1999 | Ting-Chung Hu et al. |
| 5,956,268 A | 9/1999 | Lee |
| 5,956,473 A | 9/1999 | Ting-Chung Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett |
| 7,388,781 B2 | 6/2008 | Litsyn |
| 7,395,404 B2 | 7/2008 | Gorobets |
| 7,441,067 B2 | 10/2008 | Gorobets et al. |
| 7,443,729 B2 | 10/2008 | Li |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell |
| 7,619,922 B2 | 11/2009 | Li |
| 7,697,326 B2 | 4/2010 | Sommer et al. |
| 7,706,182 B2 | 4/2010 | Shalvi et al. |
| 7,716,538 B2 | 5/2010 | Gonzalez |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun |
| 7,961,797 B1 | 6/2011 | Yang et al. |
| 7,975,192 B2 | 7/2011 | Sommer |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang |
| 8,250,324 B2 | 8/2012 | Haas |
| 8,300,823 B2 | 10/2012 | Bojinov |
| 8,305,812 B2 | 11/2012 | Levy |
| 8,327,246 B2 | 12/2012 | Weingarten |
| 8,407,560 B2 | 3/2013 | Ordentlich |
| 8,417,893 B2 | 4/2013 | Khmelnitsky |
| 2001/0034815 A1 | 10/2001 | Dugan et al. |
| 2002/0063774 A1 | 5/2002 | Hillis et al. |
| 2002/0085419 A1 | 7/2002 | Kwon |
| 2002/0154769 A1 | 10/2002 | Petersen et al. |
| 2002/0156988 A1 | 10/2002 | Toyama |
| 2002/0174156 A1 | 11/2002 | Birru |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee |
| 2003/0192007 A1 | 10/2003 | Miller et al. |
| 2004/0015771 A1 | 1/2004 | Lasser et al. |
| 2004/0030971 A1 | 2/2004 | Tanaka |
| 2004/0059768 A1 | 3/2004 | Denk |
| 2004/0080985 A1 | 4/2004 | Chang et al. |
| 2004/0153722 A1 | 8/2004 | Lee |
| 2004/0153817 A1 | 8/2004 | Norman |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen |
| 2007/0143561 A1 | 6/2007 | Gorobets |
| 2007/0150694 A1 | 6/2007 | Chang et al. |

(56) References Cited

U.S. PATENT DOCUMENTS

| | | |
|---|---|---|
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim |
| 2008/0116509 A1 | 5/2008 | Harari et al. |
| 2008/0126686 A1 | 5/2008 | Sokolov et al. |
| 2008/0127104 A1 | 5/2008 | Li |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shtick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0027961 A1 | 6/2009 | Park et al. |
| 2009/0144598 A1 | 6/2009 | Yoon |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi |
| 2009/0287930 A1 | 11/2009 | Nagaraja |
| 2009/0300269 A1 | 12/2009 | Radke et al. |
| 2009/0323942 A1 | 12/2009 | Sharon |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0174853 A1 | 7/2010 | Lee |
| 2010/0180073 A1 | 7/2010 | Weingarten et al. |
| 2010/0172179 A1 | 8/2010 | Gorobets et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette |
| 2010/0149881 A1 | 11/2010 | Lee et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0173484 A1* | 7/2011 | Schuette ............ G06F 11/0727 714/2 |
| 2011/0194353 A1 | 8/2011 | Hwang |
| 2011/0208896 A1* | 8/2011 | Wakrat ............... G06F 12/0246 711/103 |
| 2011/0209028 A1 | 8/2011 | Post |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir |
| 2014/0136883 A1* | 5/2014 | Cohen ................. G06F 11/2094 714/6.11 |
| 2014/0281766 A1* | 9/2014 | Yang ................... G06F 11/0793 714/721 |
| 2015/0006784 A1* | 1/2015 | Avila .................. G06F 12/0246 711/103 |

(56) References Cited

U.S. PATENT DOCUMENTS

| | | | |
|---|---|---|---|
| 2015/0149693 A1* | 5/2015 | Ng | G06F 3/0619 711/103 |
| 2015/0199268 A1* | 7/2015 | Davis | G06F 12/0246 711/103 |
| 2015/0339188 A1* | 11/2015 | Hu | G06F 11/1072 714/704 |

OTHER PUBLICATIONS

Search Report of PCT Patent Application WO 2009/095902 A3, dated Mar. 4, 2010.
Search Report of PCT Patent Application WO 2009/078006 A3, dated Mar. 4, 2010.
Search Report of PCT Patent Application WO 2009/074979 A3, dated Mar. 4, 2010.
Search Report of PCT Patent Application WO 2009/074978 A3, dated Mar. 4, 2010.
Search Report of PCT Patent Application WO 2009/072105 A3, dated Mar. 4, 2010.
Search Report of PCT Patent Application WO 2009/072104 A3, dated Mar. 4, 2010.
Search Report of PCT Patent Application WO 2009/072103 A3, dated Mar. 4, 2010.
Search Report of PCT Patent Application WO 2009/072102 A3, dated Mar. 4, 2010.
Search Report of PCT Patent Application WO 2009/072101 A3, dated Mar. 4, 2010.
Search Report of PCT Patent Application WO 2009/072100 A3, dated Mar. 4, 2010.
Search Report of PCT Patent Application WO 2009/053963 A3, dated Mar. 4, 2010.
Search Report of PCT Patent Application WO 2009/053962 A3, dated Mar. 4, 2010.
Search Report of PCT Patent Application WO 2009/053961 A3, dated Mar. 4, 2010.
Search Report of PCT Patent Application WO 2009/037697 A3, dated Mar. 4, 2010.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.

Akash Kumar, Sergei Sawitzki, "High-Throughput and Low Power Architectures for Reed Solomon Decoder", (a.kumar at tue.nl, Eindhoven University of Technology and sergei.sawitzki at philips. com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com , 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007
Dempster, et al., "Maximum Likelihood from Incomplete Data via the EM Algorithm", Journal of the Royal Statistical Society Series B (Methodological), vol. 39, No. 1 (1997), pp. 1-38
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344
Daneshbeh, "Bit Serial Systolic Architectures for Multiplicative Inversion and Division over GF (2)", A thesis presented to the University of Waterloo, Ontario, Canada, 2005, pp. 1-118
Chen, Formulas for the solutions of Quadratic Equations over GF (2), IEEE Trans. Inform. Theory, vol. IT-28, No. 5, Sep. 1982, pp. 792-794
Berlekamp et al., "On the Solution of Algebraic Equations over Finite Fields", Inform. Cont. 10, Oct. 1967, pp. 553-564.

\* cited by examiner

Calculating, by a memory controller, an estimate of an effect of read operations on a first flash memory entity. 110

Calculating the estimate of the effect of read operations in response to a number of read operations of a group of flash memory cells that belongs to the flash memory entity. 111

Estimating the state of the group of memory cells and trying to separate the effects or program and erase cycle from the effect of the read operations on the state of the group of flash memory cells. 112

Calculating the estimate of the effect of read operations in response to a relationship between (a) a bit error rate of data stored in the a group of flash memory cells that belongs to the flash memory entity and (b) a number of program erase cycles that the group of flash memory cells has undergone. 113

Calculating, by the memory controller, estimates of effects of read operations on multiple flash memory entities; wherein the multiple flash memory entities comprise the first flash memory entity. 114

Responding to the estimate of the effect of read operations on the first flash memory entity. 120

Receiving requests to read the data unit and reading the data unit from the second flash memory entity. 121

Erasing the first flash memory entity after writing the data unit to the second flash memory entity. 122

Preventing from erasing the first flash memory entity after writing the data unit to the second flash memory entity. 123

Determining to stop using the second flash memory entity for storing the data. 124

Resuming the utilizing the first memory entity for reading the data unit. 125

Performing, by the memory controller, at least one memory management operation in response to the estimates of the effects of read operations on the multiple flash memory entities. 126

Performing wear leveling 127

Performing, by the memory controller, at least one memory management operation in response to the estimate of the effect of read operations on the first flash memory entity. The flash memory entity may store a first data unit at a first density level. 130

Writing the first data unit to a second flash memory entity at a second density level when the estimate of the effect of read operations on the first flash memory entity exceeds a read disturb threshold. The second density level that is lower than the first density level. 131

Determining when to allocate the first flash memory entity for storing data. 132

MANAGEMENT OF MEMORY UNITS

BACKGROUND

Modern flash memory devices store information with high density on flash cells with ever smaller dimensions. Single Level Cells (SLC) store one bit per cell. Multi-Level Cells (MLC) store several bits per cell by setting the amount of charge in the cell.

Flash memory devices are organized into (physical) pages. Each page contains a section allocated for data (512 bytes-8 Kbytes) and a small amount of spare bytes (16-32 or more bytes for every 512 data bytes) containing redundancy and back pointers.

The redundancy bytes are used to store error correcting information, for correcting errors which may have occurred during the reading of the page content.

Each program operation is performed on an entire page. A number of pages are grouped together to form an erase block (also referred to as block). A page cannot be erased unless the entire block (which contains the page) is erased.

MLC devices suffer from read-disturb. Read disturb is an unintentional programming of cells caused due to read operation. The effect of read disturb is becoming a major limitation which must be treated.

Due to read disturbs, a memory controller is required to apply stronger Error Correction Coding (ECC) capabilities, or/and reduce the maximum endurance of the flash memory device or/and refresh blocks, namely, copy entire MLC blocks to other locations and erase the disturbed blocks. Re-writing an MLC block incurs performance degradation due the additional writes and reduces the endurance (increase the total program erase (P/E) cycle of the device).

SUMMARY

According to an embodiment of the invention there may be provided a method for memory management, the method may include calculating, by a memory controller, an estimate of an effect of read operations on a first flash memory entity; and performing, by the memory controller, at least one memory management operation in response to the estimate of the effect of read operations on the first flash memory entity.

The flash memory entity may store data unit at a first density level; the performing of the at least one memory management operation may include writing the data unit to a second flash memory entity at a second density level when the estimate of the effect of read operations on the first flash memory entity exceeds a read disturb threshold; and the second density level is lower than the first density level.

The method may include receiving requests to read the data unit and reading the data unit from the second flash memory entity.

The method may include erasing the first flash memory entity after writing the data unit to the second flash memory entity.

The method may include preventing from erasing the first flash memory entity after writing the data unit to the second flash memory entity; determining to stop using the second flash memory entity for storing the data; and utilizing the first memory entity for reading the data.

The calculating of the estimate of the effect of read operations may be responsive to a number of read operations of a group of flash memory cells that belongs to the flash memory entity.

The calculating of the estimate of the effect of read operations may be responsive to a relationship between (a) a bit error rate of data stored in the a group of flash memory cells that belongs to the flash memory entity and (b) a number of program erase cycles that the group of flash memory cells has undergone.

The first flash memory entity may be in an erased state during the calculating of the estimate and wherein the at least one memory management operation may include determining when to allocate the first flash memory entity for storing data.

The method may include calculating, by the memory controller, estimates of effects of read operations on multiple flash memory entities; wherein the multiple flash memory entities may include the first flash memory entity; and performing, by the memory controller, at least one memory management operation in response to the estimates of the effects of read operations on the multiple flash memory entities.

The at least one memory management operation may include wear leveling.

According to an embodiment of the invention there may be provided a non-transitory computer readable medium that may store instructions that once executed by the computer cause the computer to execute the stages of calculating an estimate of an effect of read operations on a first flash memory entity; and performing at least one memory management operation in response to the estimate of the effect of read operations on the first flash memory entity.

The flash memory entity may store a data unit at a first density level; wherein the performing of the at least one memory management operation may include writing the data unit to a second flash memory entity at a second density level when the estimate of the effect of read operations on the first flash memory entity exceeds a read disturb threshold; and wherein the second density level that is lower than the first density level.

The non-transitory computer readable medium that may store instructions for receiving requests to read the data unit and reading the data unit from the second flash memory entity.

The non-transitory computer readable medium may store instructions for erasing the first flash memory entity after writing the data unit to the second flash memory entity.

The non-transitory computer readable medium may store instructions for preventing from erasing the first flash memory entity after writing the data unit to the second flash memory entity; determining to stop using the second flash memory entity for storing the data; and utilizing the first memory entity for reading the data.

The calculating of the estimate of the effect of read operations may be responsive to a number of read operations of a group of flash memory cells that belongs to the flash memory entity.

The calculating of the estimate of the effect of read operations may be responsive to a relationship between (a) a bit error rate of data stored in the a group of flash memory cells that belongs to the flash memory entity and (b) a number of program erase cycles that the group of flash memory cells has undergone.

The first flash memory entity may be in an erased state during the calculating of the estimate and wherein the at least one memory management operation may store instructions for determining when to allocate the first flash memory entity for storing data.

The non-transitory computer readable medium may store instructions for calculating, by the memory controller, estimates of effects of read operations on multiple flash memory entities; wherein the multiple flash memory entities may include the first flash memory entity; and performing, by the memory controller, at least one memory management operation in response to the estimates of the effects of read operations on the multiple flash memory entities.

According to an embodiment of the invention there may be provided a memory controller that may include a read circuit, a write circuit, a read effect estimating circuit, and a memory management circuit; wherein the read circuit is arranged to assist in reading data from a first flash memory entity; wherein the write circuit is arranged to assist in writing data to the first flash memory entity; wherein the read effect estimating circuit is arranged to calculate an estimate of an effect of read operations on a first flash memory entity; and wherein the memory management circuit is arranged to perform at least one memory management operation in response to the estimate of the effect of read operations on the first flash memory entity.

The flash memory entity may store data unit at a first density level; the memory management circuit may be arranged to perform the at least one memory management operation by writing the data unit to a second flash memory entity at a second density level when the estimate of the effect of read operations on the first flash memory entity exceeds a read disturb threshold. The second density level is lower than the first density level.

The read circuit may be arranged to receive requests to read the data unit and read the data unit from the second flash memory entity.

The memory controller may include an erase circuit that may be arranged to erase the first flash memory entity after writing the data unit to the second flash memory entity.

The memory controller may be arranged to prevent from erasing the first flash memory entity after writing the data unit to the second flash memory entity; determine to stop using the second flash memory entity for storing the data; and utilize the first memory entity for reading the data.

The read effect estimating circuit may be arranged to calculate the estimate of the effect of read operations in response to a number of read operations of a group of flash memory cells that belongs to the flash memory entity.

The read effect estimating circuit may be arranged to calculate the estimate of the effect of read operations in response to a relationship between (a) a bit error rate of data stored in the a group of flash memory cells that belongs to the flash memory entity and (b) a number of program erase cycles that the group of flash memory cells has undergone.

The first flash memory entity may be in an erased state during the calculating of the estimate and wherein the memory management circuit may be arranged to determine when to allocate the first flash memory entity for storing data.

The read effect estimating circuit may be arranged to calculate estimates of effects of read operations on multiple flash memory entities; wherein the multiple flash memory entities may include the first flash memory entity; and wherein the memory management circuit may be arranged to perform at least one memory management operation in response to the estimates of the effects of read operations on the multiple flash memory entities.

The at least one memory management operation may include wear leveling.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 1 illustrates a method according to an embodiment of the invention;

DETAILED DESCRIPTION

Figure 2:
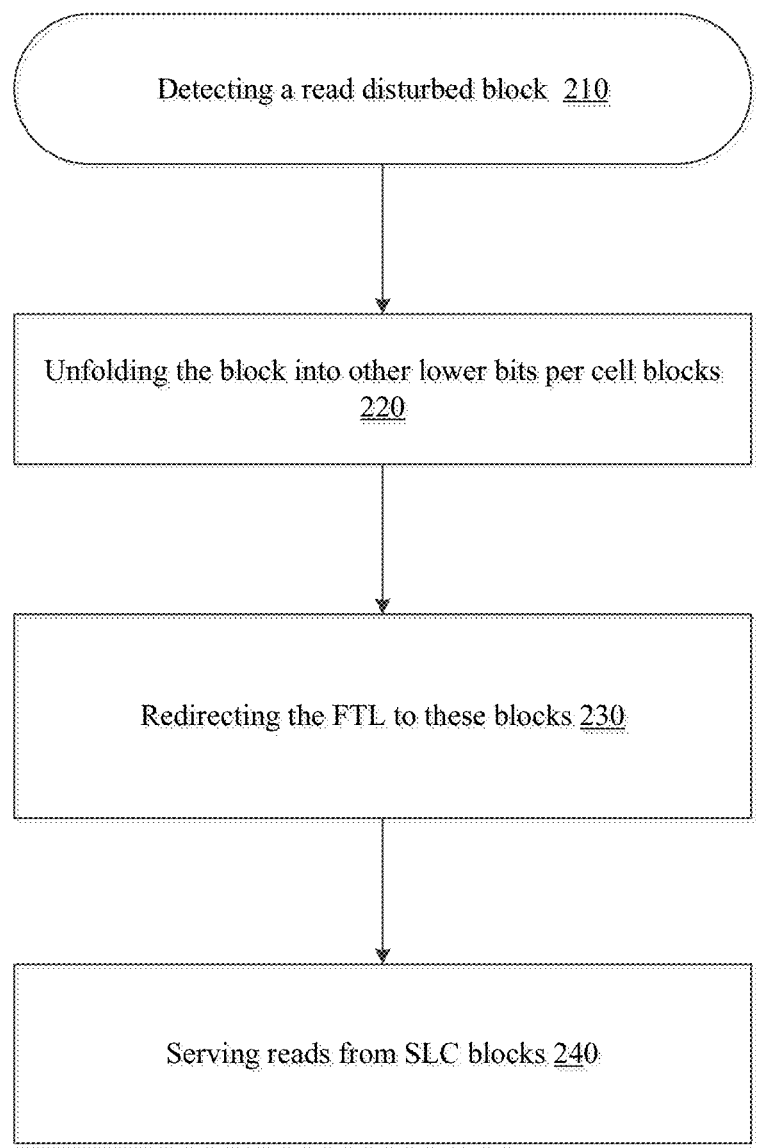
FIG. 2 illustrates a method according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

There are provided methods, systems and computer readable media for read-disturb aware memory management.

A X-bit per cell block may be used for storing between 1 to X bits per cell. The ability to use a blocks with less than its maximal density may help to reduce programming and reading latencies, increase reliability and dramatically reduces read-disturb effect while trading off capacity.

In some cases, there are some blocks that are read more frequently than other blocks of the flash memory device. For example, blocks that store the operating-system files are not re-written frequently but are read extensively. These blocks can suffer from read disturb phenomena although their state is not reflected in the program and erase count.

In order to detect read-disturbed blocks the memory controller may measure or estimates the number of reads made from each block.

The estimation can be based on the bit error rate (BER) measured by a decoder of the memory controller and on the program erase (P/E) counter of the block. The value of the P/E block may provide an indication of the effect of the write operations applied on the block while the BER may provide an indication about the state of the block—that is affected by both read and write operations.

Some memory controllers adjust the read thresholds (used during read operations) in response to an actual or an estimated state of the block. The read disturb can be evaluated from the values of these read thresholds.

Another approach for estimating the number of reads is to actually count the number of reads. Namely, in each page request, increment the block's read counter by 1. When the block is erased, the block's read counter can be reset but this is not necessarily so. One can combine estimation and counting approach first estimate the number of reads (e.g., after power cycle) and from that point on maintain read counters for each block.

According to an embodiment of the invention when the number of reads exceeds a certain threshold (e.g., 5000 reads) it may be assumed that the block might suffer from read disturb effect. At this point the memory controller may copy the content of the X bit per cell block into a set of lower density blocks (less than X bit per cell blocks) such as SLC blocks and redirect the reads to these blocks. The copying of content from a source block in which the content was programmed at a first density to one or more target blocks in which the content is programmed at a second density (that is lower than the first density) is also referred to as unfolding.

Copying the content to less dense blocks such as SLC blocks (or fewer bit-per cell blocks) is that they have higher tolerance for read-disturb (i.e., they can withstand higher number of reads before the block must be re-written), they can give better read performance (the read duration of read) and they have much larger endurance (i.e., SLC blocks can endure (for example >100K P/E) cycles while TLC blocks can only endure (for example <1000 P/E cycles).

If the unfolded block needs to be re-written due to data change, the system can decide to delete the unfolded blocks and treat the re-write as regular block (it is noted that when data is changed, the system can delete the unfolded block, and return to "regular" mode where the original block holds the data, and continue with the data update phase), or use the unfolded blocks as a basis for the block data update (updating a piece of data in NAND devices require a complete block re-write, namely, reading all original data, updating the changed data and writing the new fresh data to an empty block).

The SLC/MLC blocks, which are used as an unfolded copy of some block, are taken from a special pool or regular spare blocks pool. If the system needs these spare blocks (which are now used as an unfolded version of a block), the system can reclaim these blocks immediately by redirecting back the reads to the original block. The overhead of reclaiming is very small since the original block is untacked. From this point on the system can decided to refresh the block or continue serving the reads from the original block or to re-unfold the block when spare blocks will be available.

The same proposal can be applied on individual pages in blocks, namely, detect set of individual pages, which are read frequently, and move these pages into SLC (or MLC/TLC) block.

The proposed approach can be regarded as read caching where intensively accessed pages for read are copied to other location to serve read requests.

It is noted that when unfolding a block to a target block (or target blocks) of a lower-bit per cell the programming parameters may be adjusted to a read disturb scenario. When programming a block the parameters, which are used for programming, should be chosen so that they are suitable for retention and read-disturb effects. However, in the unfolded block it can be assumed that only read-disturb effect will be "active" (if the unfolded block ages, we can re-use the original block). Therefore, even better immunity for read-disturb effect can be gained.

Figure 4:
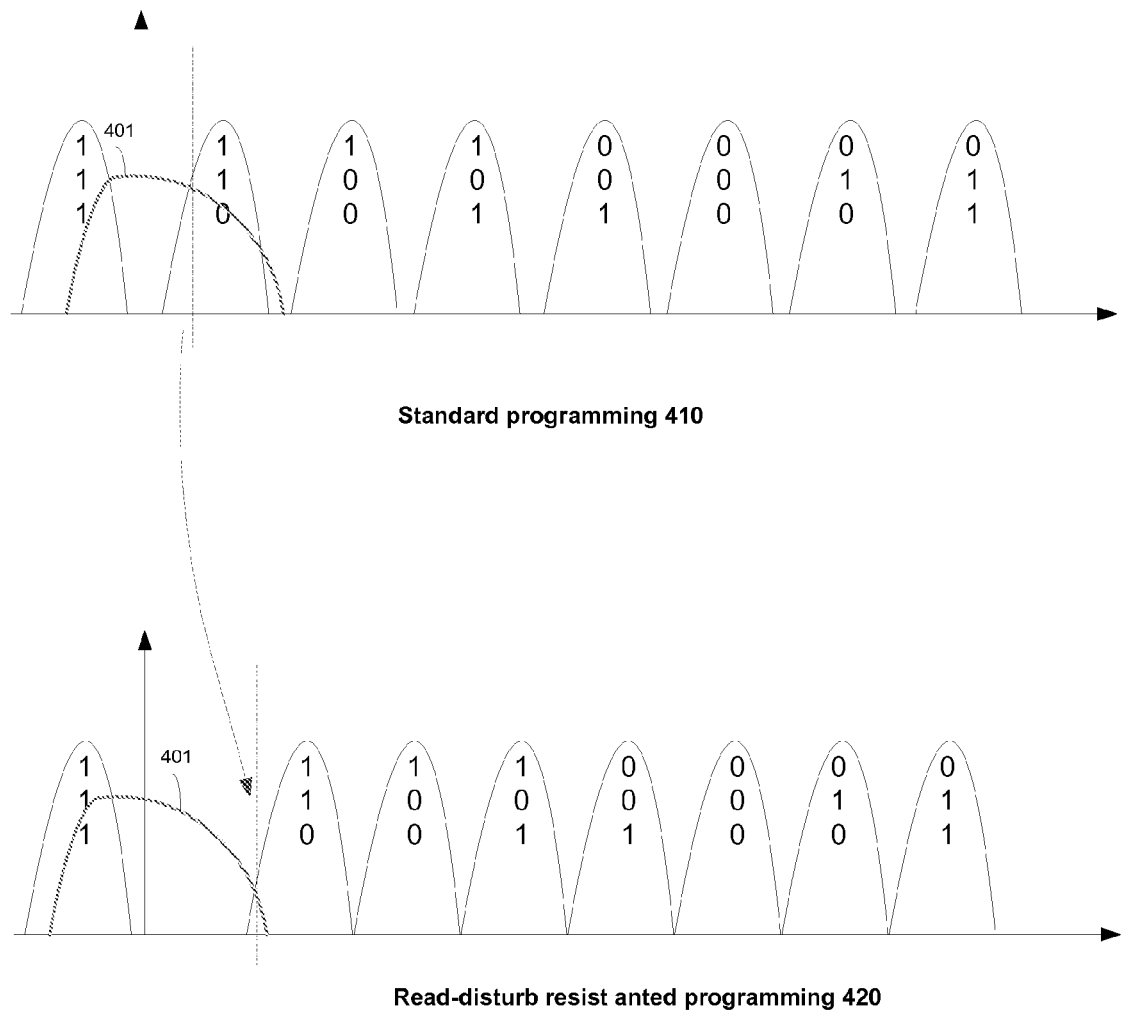
FIG. 4 illustrates a change in a threshold voltage distribution introduced in order to reduce the effect of read disturb according to an embodiment of the invention.

Read disturb can cause the erase lobe to widen and overlap the first non-erase lobe. The widened erase lobe is denoted 401 in FIG. 4. Mitigating the read disturb effect can include, (as illustrated in FIG. 4), using (instead of an even spaced threshold voltage distribution 410) a non-evenly spaced threshold voltage distribution (420) that has a first non-erase lobe that can be programmed such that it will be as far as possible from the other lobes. This programming approach will reduce the BER related to the first threshold while increase the BER in the other thresholds to compensate over the read disturb effect which increase dramatically the BER related to the first threshold due to erase lobe penetration to the first lobe (i.e., erase cells which are unintentionally programmed have higher Vth).

The terms "group of flash memory cells" and "flash memory entity" may be a page, a portion of a page, more than a single page, an erase block or more than an erase block.

A density of programming a flash memory cell refers to the number of bits per flash memory cell that are used. For example, a three bit per cell flash memory cell can be SLC programmed and his density will be regarded as being one bit per cell.

FIG. 1 illustrates method 100 according to an embodiment of the invention.

Method 100 may start by stage 110 of calculating, by a memory controller, an estimate of an effect of read operations on a first flash memory entity.

Stage 110 may include at least one of the following:
a. Calculating (111) the estimate of the effect of read operations in response to a number of read operations of a group of flash memory cells that belongs to the flash memory entity.
b. Estimating (112) the state of the group of memory cells and trying to separate the effects or program and erase cycle from the effect of the read operations on the state of the group of flash memory cells.
c. Calculating (113) the estimate of the effect of read operations in response to a relationship between (a) a bit error rate of data stored in the a group of flash memory cells that belongs to the flash memory entity and (b) a number of program erase cycles that the group of flash memory cells has undergone. This calculating may include estimating an expected BER that results from the read and program operations and compare this expected BER to the actual or estimated BER of the first memory unit.

Stage 110 may be followed by stage 120 of responding to the estimate of the effect of read operations on the first flash memory entity.

Stage 120 may include stage 130 of performing, by the memory controller, at least one memory management operation in response to the estimate of the effect of read operations on the first flash memory entity. The flash memory entity may store a first data unit at a first density level.

Stage 130 may include stage 131 of writing the first data unit to a second flash memory entity at a second density level when the estimate of the effect of read operations on the first flash memory entity exceeds a read disturb threshold. The second density level that is lower than the first density level. This writing operation is referred to as unfolding.

Stage 131 may be followed by at least one of the following stages (of stage 120):
a. Stage 121 of receiving requests to read the data unit and reading the data unit from the second flash memory entity.
b. Stage 122 of erasing the first flash memory entity after writing the data unit to the second flash memory entity.
c. Stage 123 of preventing from erasing the first flash memory entity after writing the data unit to the second flash memory entity.
d. Stage 124 of determining to stop using the second flash memory entity for storing the data.
e. Stage 125 of resuming the utilizing the first memory entity for reading the data unit. If the data unit was not erased from the first memory entity then this resuming has virtually no impact on the memory module.

The first flash memory entity may be in an erased state during the calculating of the estimate and stage 130 may include stage 132 of determining when to allocate the first flash memory entity for storing data.

Stage 110 may include stage 114 of calculating, by the memory controller, estimates of effects of read operations on multiple flash memory entities, wherein the multiple flash memory entities comprise the first flash memory entity.

Stage 120 may include stage 126 of performing, by the memory controller, at least one memory management operation in response to the estimates of the effects of read operations on the multiple flash memory entities.

Stage 126 may include stage 127 of performing wear leveling—attempting to allocate flash memory entities to be written such as to substantially maintain a same wear level of all flash memory entities. This wear leveling is responsive not only to (intentional) program and erase operations but also to read operations and to read disturb effects.

FIG. 2 illustrates method 200 according to an embodiment of the invention.

Method 200 may start by stage 210 of detecting a read disturbed block.

Stage 210 may be followed by stage 220 of unfolding the block into other lower bits per cell block, for example, SLC blocks. This may include writing the content of the read disturbed block to other blocks, wherein the writing is performed at a lower density than the density of the data at the read disturbed block. For example, content written at a density of 3 bpc will be written at a lower density of 2 bpc or 1 bpc.

It is noted that the unfolding can be done to other TLC blocks (not necessarily SLC or MLC block). Single TLC block can hold pages from other TLC blocks, which are frequently accessed. The programming of this block can be done using "special" read-disturb programming parameters.

Stage 220 may be followed by stage 230 of redirecting the FTL to these blocks. The FTL is the flash translation layer which maps a logical (user) address in to the physical address (the actual page/block in which the data resides).

The user of the flash device uses logical address while the flash controller needs to know exactly where he placed the user's data using the FTL entity. It is noted that the physical address might change due to wear leveling data update etc. The FTL reflects these changes.

Stage 230 may be followed by stage 240 of serving read requests of the content (reads) from the lower density (for example SLC) blocks.

Figure 3:
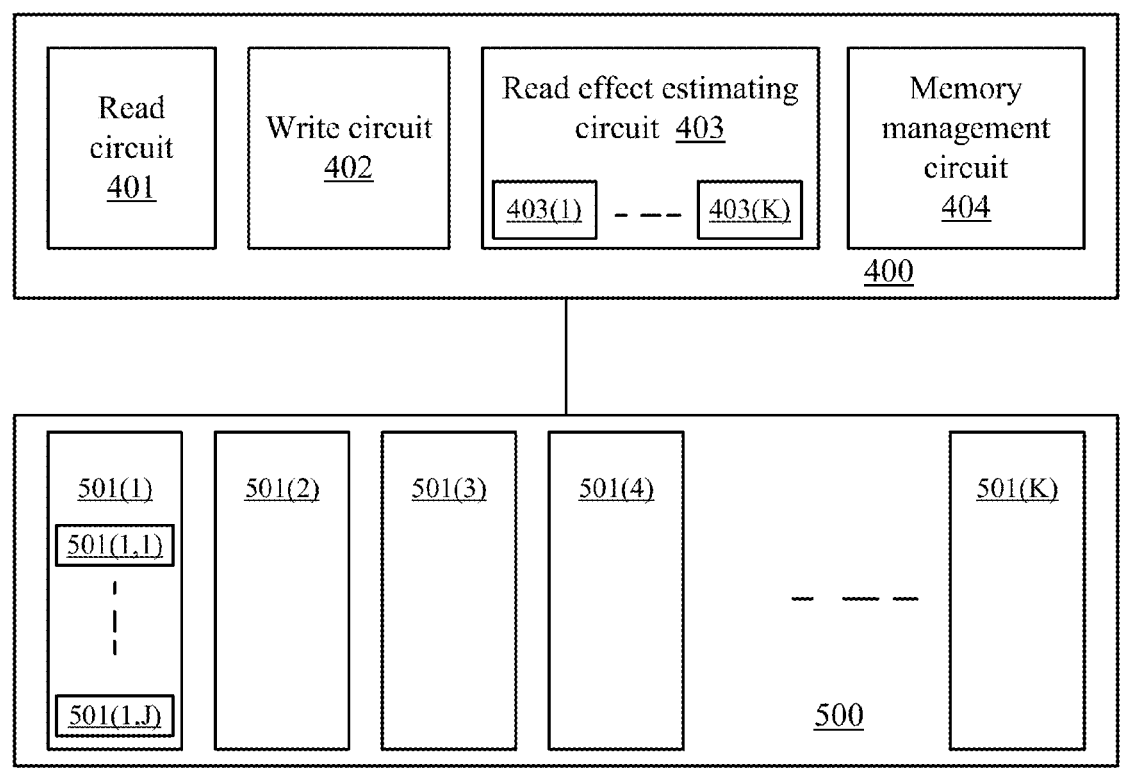
FIG. 3 illustrates a memory controller and a flash memory module according to an embodiment of the invention.

FIG. 3 illustrates a memory controller 400 and a flash memory module 500 according to an embodiment of the invention.

The flash memory module 500 may include multiple erase blocks 501(1)-501(K), each erase block may include multiple pages. For example, erase block 501(1) is illustrated as including pages 501(1,1)-501(1,J). K and J being positive integers. Each page includes multiple flash memory cells. The flash memory cells may be arranged in a NAND formation (although they may be arranged in other formations such as a NOR formation). Accordingly, a column of flash memory cells is connected to a sensors whereas the read flash memory cell receives a threshold voltage while other flash memory cells of the column that are not read are provided with a bias voltage.

Memory controller 400 includes read circuit 401, a write circuit 402, a read effect estimating circuit 403, and a memory management circuit 404. All these circuits may be implemented by a processor and/or a dedicated hardware or both.

The read circuit 401 is arranged to assist in reading data from a first flash memory entity (such as any block and/or page of flash memory module 500). The assisting may include sending a read command to the flash memory module 500, receiving a response to the read command, and/or performing the entire reading process.

The write circuit 402 is arranged to assist in writing data to the first flash memory entity. The assisting may include sending a write command to the flash memory module 500, receiving a response to the write command, and/or performing the entire writing process.

The read effect estimating circuit 403 is arranged to calculate an estimate of an effect of read operations on a first flash memory entity. The read effect estimating circuit 403 may execute stage 110 of method 100. Read effect estimating circuit 403 may store indications about the effects of read operation on blocks 501(1)-501(K) and/or on pages of these blocks. FIG. 3 illustrates read counters 403(1)-403(K)—one read counter per block. There may be read counters for other units such as for pages. There may be buffers for storing other read effect metrics.

The memory management circuit 404 is arranged to perform at least one memory management operation in response to the estimate of the effect of read operations on the first flash memory entity. The memory management circuit 404 may execute stage 130 of method 100.

For example, content written at 3 bpc block 501(1) can be written at a density of 1 bpc to blocks 501(2)-502(4).

Figure 5:
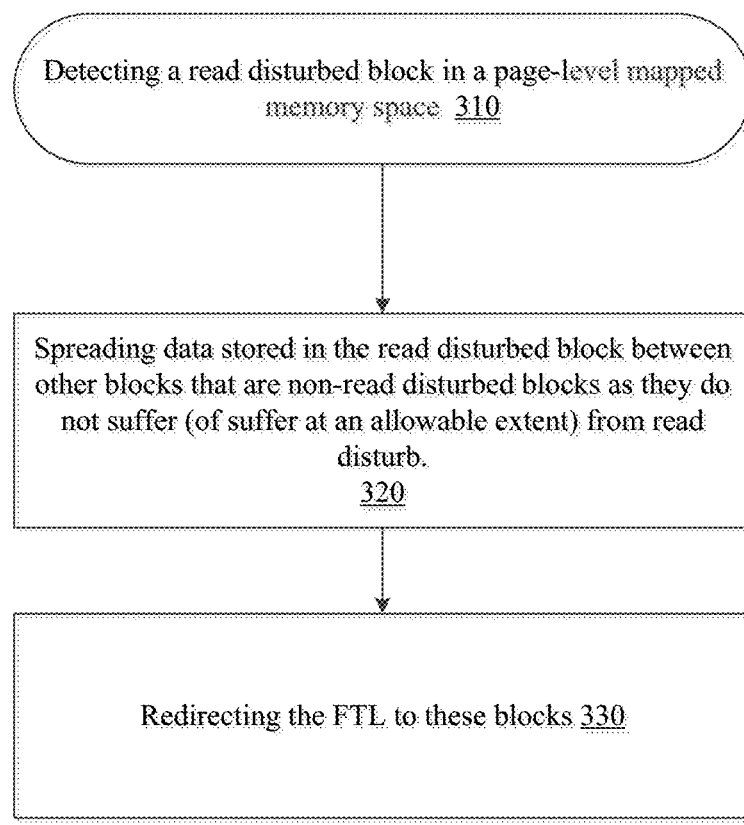
FIG. 5 illustrates a method according to an embodiment of the invention.

FIG. 5 illustrates method 300 according to an embodiment of the invention.

Method 300 may start by stage 310 of detecting a read disturbed block in a page-level mapped memory space.

Stage 310 may be followed by stage 320 of spreading data stored in the read disturbed block between other blocks that are non-read disturbed blocks as they do not suffer (of suffer at an allowable extent) from read disturb.

Stage 320 may be followed by stage 230 of redirecting the FTL to these blocks.

Method 300 may mitigate dramatically the effect of read disturb as the following numerical example shows:
 a. Assuming a block holds 512 pages, the block suffers from read disturb. Thus—its content is frequently read.
 b. Assuming we can distribute these pages over other (for example 512) blocks which are not suffering from read-disturb. Hence, each page (which is still read frequently) will add 1/512 reads (when we say that a block can suffer 10,000 reads, we mean 10,000 full block reads). Namely, the read-disturb effect will be reduced by 512.
 c. This operation of distributing the pages over other blocks can be done when the device is managed in page-level-mapping fashion (oppose to block-level-mapping where pages which belongs to certain block must "stay" together).

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following magnetic storage media including disk and tape storage media; optical storage media such as compact disk media (e.g., CD-ROM, CD-R, etc.) and digital video disk storage media; nonvolatile memory storage media including semiconductor-based memory unit s such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, unit s or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. In addition, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. Moreover, if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or unit s implemented in non-programmable hardware but can also be applied in programmable devices or unit s able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A method for memory management, the method comprising: maintaining, by a memory controller, read counters for each flash memory entity in a flash memory array coupled to the memory controller, the read counters being configured to store indications about effects of read operations on associated flash memory entities and being configured to be incremented each time associated flash memory entities are subjected to a read operation; calculating, with reference to a first read counter associated with a first flash memory entity, an estimate of an effect of read operations on the first flash memory entity; and performing, by the memory controller, at least one memory management operation in response to the estimate of the effect of read operations on the first flash memory entity, wherein the at least one memory management operation is performed with reference to a programming parameter that is chosen based on a read disturb scenario and which indicates whether the at least one memory management operation is to move a data unit from the first flash memory entity to another flash memory entity having a same or lower density level, wherein the calculating of the estimate of the effect of read operations is responsive to a relationship between (a) a bit error rate of data stored in a group of flash memory cells that belongs to the first flash memory entity and (b) a number of program erase cycles that the group of flash memory cells has undergone.

2. The method according to claim 1 wherein the first flash memory entity stores the data unit at a first density level; wherein the performing of the at least one memory management operation comprises writing the data unit to a second flash memory entity at a second density level when the estimate of the effect of read operations on the first flash memory entity exceeds a read disturb threshold; and wherein the second density level that is lower than the first density level.

3. The method according to claim 2 comprising receiving requests to read the data unit and reading the data unit from the second flash memory entity and wherein the second flash memory entity is configured to store data units at the first density level even though the second flash memory entity is used to store the data unit at the second density level.

4. The method according to claim 2 wherein the method comprises erasing the first flash memory entity after writing the data unit to the second flash memory entity.

5. The method according to claim 2 wherein the method comprises: preventing from erasing the first flash memory entity after writing the data unit to the second flash memory entity; determining to stop using the second flash memory entity for storing the data; and utilizing the first memory entity for reading the data.

6. The method according to claim 1, wherein the calculating of the estimate of the effect of read operations is responsive to a number of read operations of a group of flash memory cells that belongs to the first flash memory entity.

7. The method according to claim 1 wherein the first flash memory entity is in an erased state during the calculating of the estimate and wherein the at least one memory management operation comprises determining when to allocate the first flash memory entity for storing data.

8. The method according to claim 1 wherein the method comprises: calculating, by the memory controller, estimates of effects of read operations on multiple flash memory entities; wherein the multiple flash memory entities comprise the first flash memory entity; and performing, by the memory controller, at least one memory management operation in response to the estimates of the effects of read operations on the multiple flash memory entities.

9. The method according to claim 8 wherein the at least one memory management operation comprises wear leveling.

10. A non-transitory computer readable medium that stores instructions that once executed by the computer cause the computer to execute the stages of: maintaining read counters for each flash memory entity in a flash memory array, the read counters being configured to store indications about effects of read operations on associated flash memory entities and being configured to be incremented each time associated flash memory entities are subjected to a read operation; calculating, with reference to a first read counter associated with a first flash memory entity, an estimate of an effect of read operations on the first flash memory entity; and performing at least one memory management operation in response to the estimate of the effect of read operations on the first flash memory entity, wherein the at least one memory management operation is performed with reference to a programming parameter that is chosen based on a read disturb scenario and which indicates whether the at least one memory management operation is to move a data unit from the first flash memory entity to another flash memory entity having a same or lower density level, wherein the calculating of the estimate of the effect of read operations is responsive to a relationship between (a) a bit error rate of data stored in a group of flash memory cells that belongs to the first flash memory entity and (b) a number of program erase cycles that the group of flash memory cells has undergone.

11. The non-transitory computer readable medium according to claim 10 wherein the first flash memory entity stores the data unit at a first density level; wherein the performing of the at least one memory management operation comprises writing the data unit to a second flash memory entity at a second density level when the estimate of the effect of read operations on the first flash memory entity exceeds a read disturb threshold; and wherein the second density level that is lower than the first density level.

12. The non-transitory computer readable medium according to claim 11 that stores instructions for receiving requests to read the data unit and reading the data unit from the second flash memory entity.

13. The non-transitory computer readable medium according to claim 11 wherein the non-transitory computer readable medium stores instructions for erasing the first flash memory entity after writing the data unit to the second flash memory entity.

14. The non-transitory computer readable medium according to claim 11 wherein the non-transitory computer readable medium stores instructions for: preventing from erasing the first flash memory entity after writing the data unit to the second flash memory entity; determining to stop using the second flash memory entity for storing the data; and utilizing the first memory entity for reading the data.

15. The non-transitory computer readable medium according to claim 10, wherein the calculating of the estimate of the effect of read operations is responsive to a number of read operations of a group of flash memory cells that belongs to the first flash memory entity.

16. The non-transitory computer readable medium according to claim 10 wherein the first flash memory entity is in an erased state during the calculating of the estimate and wherein the at least one memory management operation stores instructions for determining when to allocate the first flash memory entity for storing data.

17. The non-transitory computer readable medium according to claim 10 wherein the non-transitory computer readable medium stores instructions for: calculating, by the memory controller, estimates of effects of read operations on multiple flash memory entities; wherein the multiple flash memory entities comprise the first flash memory entity; and performing, by the memory controller, at least one memory management operation in response to the estimates of the effects of read operations on the multiple flash memory entities.

18. A memory controller that comprises a read circuit, a write circuit, a read effect estimating circuit, and a memory management circuit; wherein the read circuit is arranged to assist in reading data from a first flash memory entity; wherein the write circuit is arranged to assist in writing data to the first flash memory entity; wherein the read effect estimating circuit is arranged to maintain read counters for each flash memory entity in a flash memory array, the read counters being configured to store indications about effects of read operations on associated flash memory entities and being configured to be incremented each time associated flash memory entities are subjected to a read operation; calculate, with reference to a first read counter associated with the first flash memory entity, an estimate of an effect of read operations on the first flash memory entity; wherein the memory management circuit is arranged to perform at least one memory management operation in response to the estimate of the effect of read operations on the first flash memory entity; and wherein the at least one memory management operation is performed with reference to a programming parameter that is chosen based on a read disturb scenario and which indicates whether the at least one memory management operation is to move a data unit from the first flash memory entity to another flash memory entity having a same or lower density level, wherein the read effect estimating circuit is arranged to calculate the estimate of the effect of read operations on the first flash memory entity in response to a relationship between (a) a bit error rate of data stored in a group of flash memory cells that belongs to the first flash memory entity and (b) a number of program erase cycles that the group of flash memory cells has undergone.

19. The memory controller according to claim 18 wherein the first flash memory entity is arranged to store the data unit at a first density level; and wherein the memory management circuit is arranged to perform the at least one memory management operation by instructing the write circuit to write the data unit to a second flash memory entity at a second density level when the estimate of the effect of read operations on the first flash memory entity exceeds a read disturb threshold; and wherein the second density level that is lower than the first density level.

20. The memory controller according to claim 19 wherein the memory controller is arranged to prevent from erasing the first flash memory entity after writing the data unit to the second flash memory entity; determine to stop using the second flash memory entity for storing the data; and utilize the first memory entity for reading the data.

21. The memory controller according to claim 18 wherein the read effect estimating circuit is arranged to calculate the estimate of the effect of read operations on the first flash memory entity in response to a number of read operations of a group of flash memory cells that belongs to the first flash memory entity.

* * * * *